United States Patent
Huang

(10) Patent No.: US 6,958,530 B1
(45) Date of Patent: Oct. 25, 2005

(54) RECTIFICATION CHIP TERMINAL STRUCTURE

(75) Inventor: Wen-Huo Huang, Hsinchu Hsien (TW)

(73) Assignee: Sung Jung Minute Industry Co., Ltd., Hsinchu Hsien (TW)

( * ) Notice: Subject to any disclaimer, the term of this patent is extended or adjusted under 35 U.S.C. 154(b) by 0 days.

(21) Appl. No.: 10/929,484

(22) Filed: Aug. 31, 2004

(51) Int. Cl.⁷ .......................... H01L 23/06; H01L 23/48
(52) U.S. Cl. ...................... 257/684; 257/687; 257/696
(58) Field of Search ................................ 257/658, 684, 257/690, 692, 696, 779, 784, 678, 687

(56) References Cited

U.S. PATENT DOCUMENTS

| 5,005,069 | A | * | 4/1991 | Wasmer et al. | ............. 257/687 |
| 6,060,776 | A | * | 5/2000 | Spitz et al. | ................. 257/706 |
| 6,160,309 | A | * | 12/2000 | Le | ............................... 257/684 |
| 6,559,529 | B2 | * | 5/2003 | Torti et al. | .................... 257/684 |
| 6,894,377 | B2 | * | 5/2005 | Huang | ........................ 257/684 |

* cited by examiner

*Primary Examiner*—T. N. Quach
(74) *Attorney, Agent, or Firm*—Birch, Stewart, Kolasch & Birch, LLP

(57) ABSTRACT

A rectification chip terminal structure for soldering a rectification chip on a terminal filled with a packaging material to form a secured mounting for the rectification chip is to be inserted in a coupling bore of a circuit board. The structure includes a helical buffer portion, a spacer zone containing a space, a tapered section inclining towards the center of the terminal, a bend spot having latch rings to provide coupling, and a deck having a bulged ring. The structure can prevent bending and deformation under external forces, and form a stress buffer zone to prevent the chip from being damaged and moisture from entering. It can be installed easily in the coupling bore of the circuit board and hold the packaging material securely without breaking away.

5 Claims, 3 Drawing Sheets

RECTIFICATION CHIP TERMINAL STRUCTURE

FIELD OF THE INVENTION

The present invention relates to a rectification chip terminal structure and particularly to a terminal structure for power rectifiers.

BACKGROUND OF THE INVENTION

A conventional rectification terminal generally has a deck to hold a tin plate and a chip mounted onto the tin plate. The tin is heated and melted to solder the chip on the terminal deck, then the terminal is encased and packaged by plastics or resin.

The rectification chip terminal structure set forth above has many problems remained to be resolved. Two of the conventional structures are discussed below as reference.

Refer to FIG. 1 for a conventional rectification chip terminal structure. It includes a conductive element 10, a rectification chip 11 and a terminal portion 12. The conductive element 10 is thin and elongated. It has a low fatigue limit to withstand external forces. In the event that the external forces exceed the fatigue limit, the conductive element 10 tends to deform and break away from the chip, or even rupture. Moreover, the power distributor that uses the rectification chip terminal generates heat during operation and causes the conductive element 10 to expand at high temperature. This could cause soldering defect of the conductive element 10 and the rectification chip 11 and damage of the rectification chip 11. All this affects electric current running through the conductive element 10 and results in abnormal operation of the power distributor. It could even damage an engine. In addition, the terminal portion 12 thus designed is not easy to install and tends to damage the chip during installation and results in seeping of moisture. Furthermore, the packaging material is different from the terminal material, separation of these materials is prone to occur. All this shows that there are still rooms for improvement.

FIG. 2 illustrates the structure of another conventional rectification chip terminal. It includes a conductive element 20, a rectification chip 21 and a terminal portion 22. The conductive element 20 is formed with a bending head which may sway back and forth to withstand external forces. The conductive element 20 thus formed has a greater fatigue limit. But it can bend only forwards and backwards. In the event that the external forces come from all directions, the forces from the left and right sides still will cause deformation of the conductive element 20 and affect electric current flowing through the conductive element 20. As a result, the power distributor distributes electricity unevenly and the engine might damage. All other problems previously discussed that relate to the structure of the terminal portion 22 still exist. The high temperature effect and expansion of the conductive element 20 during operation resulting from the power distributor, and the ensuing soldering defect and breaking down of the rectification chip 21 also exist. Although it has some alterations on the conductive element 20 and the structure, those problems remain to be resolved.

Based on previously discussion, it is clear that the conventional conductive element cannot totally prevent bending and deformation. The terminal portion is difficult to install and tends to cause many ill effects.

SUMMARY OF THE INVENTION

Therefore the primary object of the present invention is to solve the aforesaid disadvantages. The present invention provides an improved rectification chip terminal structure that can withstand external forces from all directions without exceeding the fatigue limit of the conductive element, and also overcome the problems resulting from the structure of the terminal portion.

The rectification chip terminal structure according to the invention includes:

- a base to solder on the back side of a rectification chip;
- a root extending upwards from the base;
- a buffer portion having one end connecting to the root and a helical structure to prevent bending and deformation under external forces;
- a deck located in the rectification chip terminal for soldering the rectification chip having a bulged ring extending upwards for coupling;
- a surrounding portion to surround a distal end of the rectification chip terminal;
- a spacer zone surrounding the periphery of the deck and having a space to form a stress buffer zone and prevent moisture from entering;
- a tapered section located on the top end of the surrounding portion inclining towards the center of the rectification chip terminal to facilitate insertion and installation; and
- a bend spot located between the surrounding portion and the tapered section having a plurality of latch rings for coupling and preventing moisture from seeping in.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
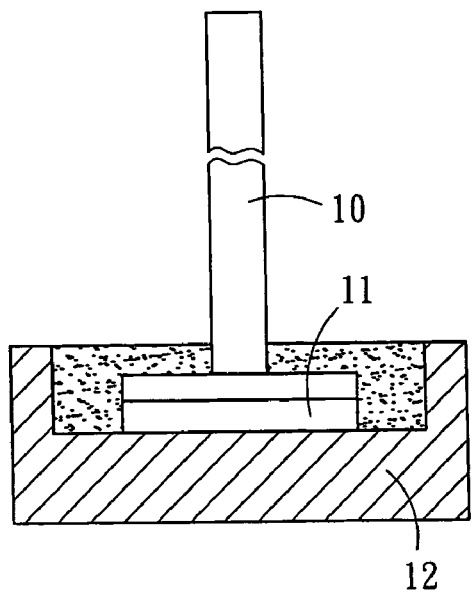
FIG. 1 is a schematic view of the structure of a conventional rectification chip terminal.
Figure 2:
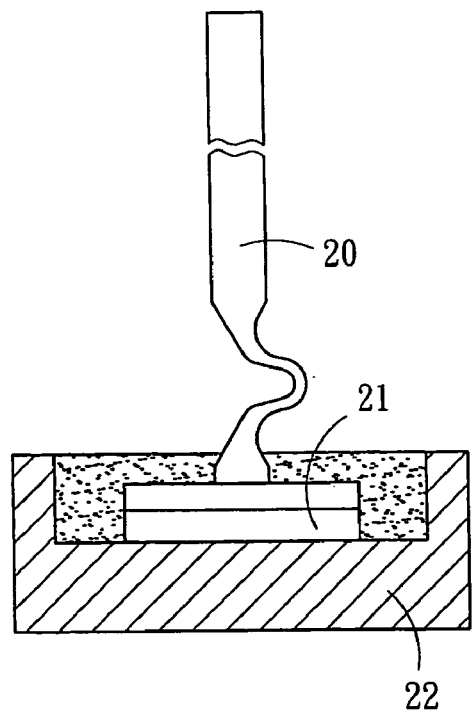
FIG. 2 is a schematic view of the structure of another conventional rectification chip terminal.
Figure 3:
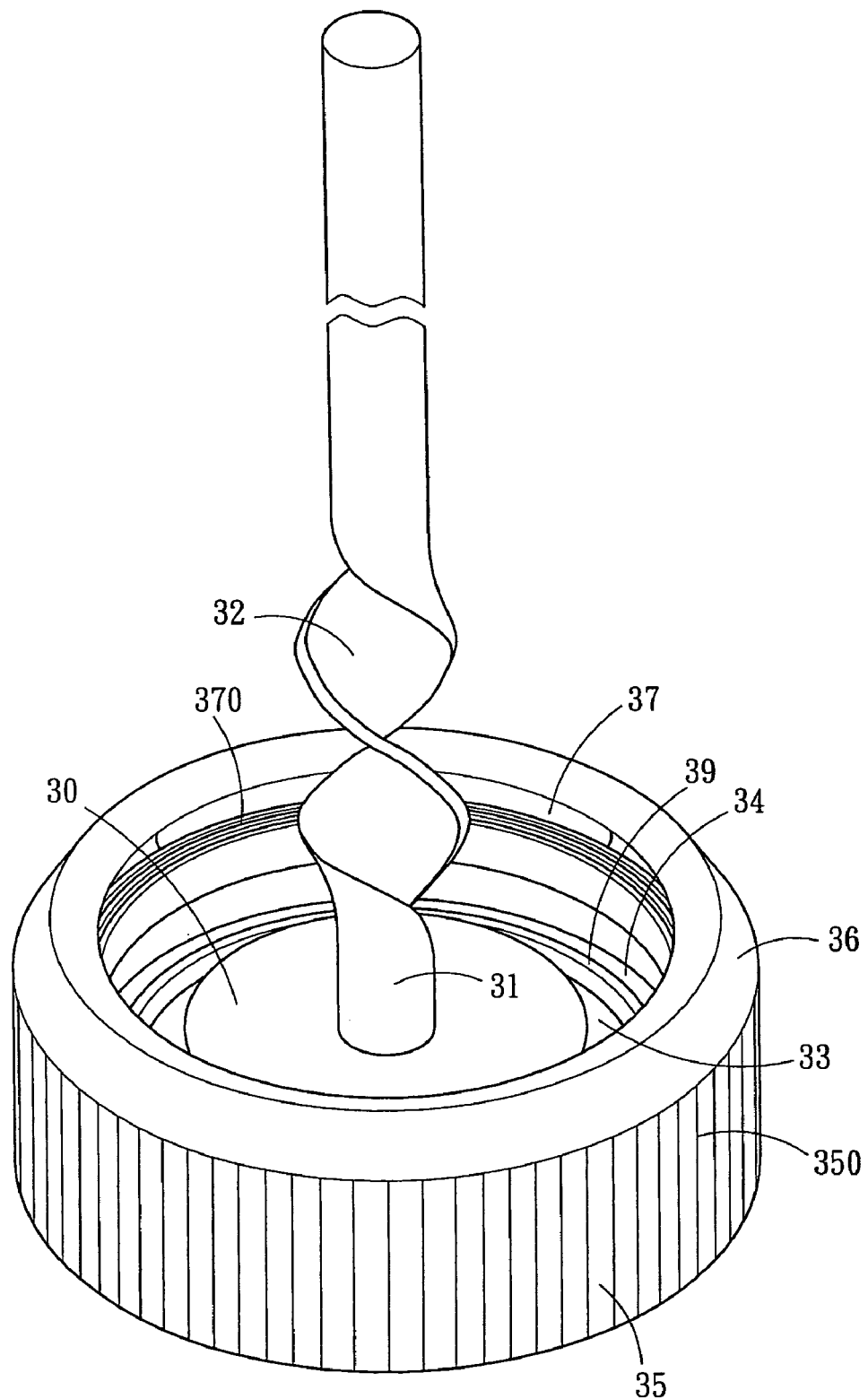
FIG. 3 is a perspective view of the present invention.
Figure 4:
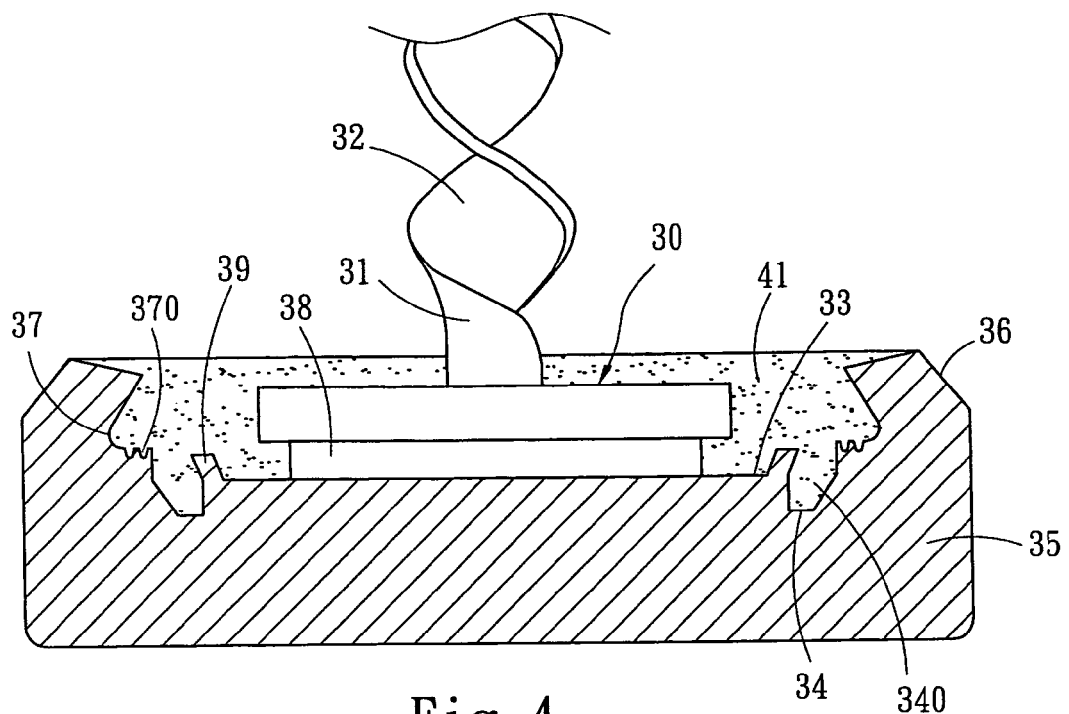
FIG. 4 is a sectional view of the invention.

Please referring to FIGS. 3 and 4, the rectification chip terminal according to the present invention has a plurality of bulged traces 350 on the peripheral surface, a rectification chip 38, a plate type base 30 soldering on a back side of the rectification chip 38, a root 31 extending upwards from the base and having one end connected to a buffer portion 32 which has a helical structure to prevent bending and deformation under external forces, and a deck 33 located in the terminal to enable the rectification chip 38 to be soldered thereon. The deck 33 has a bulged ring 39 extended therefrom for coupling with packaging material 41 and prevent the packaging material 41 from breaking away. The deck 33 is surrounded by a spacer zone 34 on the periphery that has a space 340 to form a stress buffer zone and prevent moisture from entering. The rectification chip terminal has a distal end forming a surrounding portion 35 which has a tapered section 36 on the top end inclining towards the center of the rectification chip terminal to facilitate insertion and installation. The surrounding portion 35 and the tapered section 36 form a bend spot 37 therebetween to hold the packaging material 41 and prevent the moisture from seeping in. The bend spot 37 has a plurality latch rings 370 (may be annular ditches or flanges as shown in the drawings). The latch rings 370 provide coupling function and also prevent the moisture from seeping in.

By means of the structure set forth above, the problems occurred to the conventional designs can be overcome.

Figure 5:
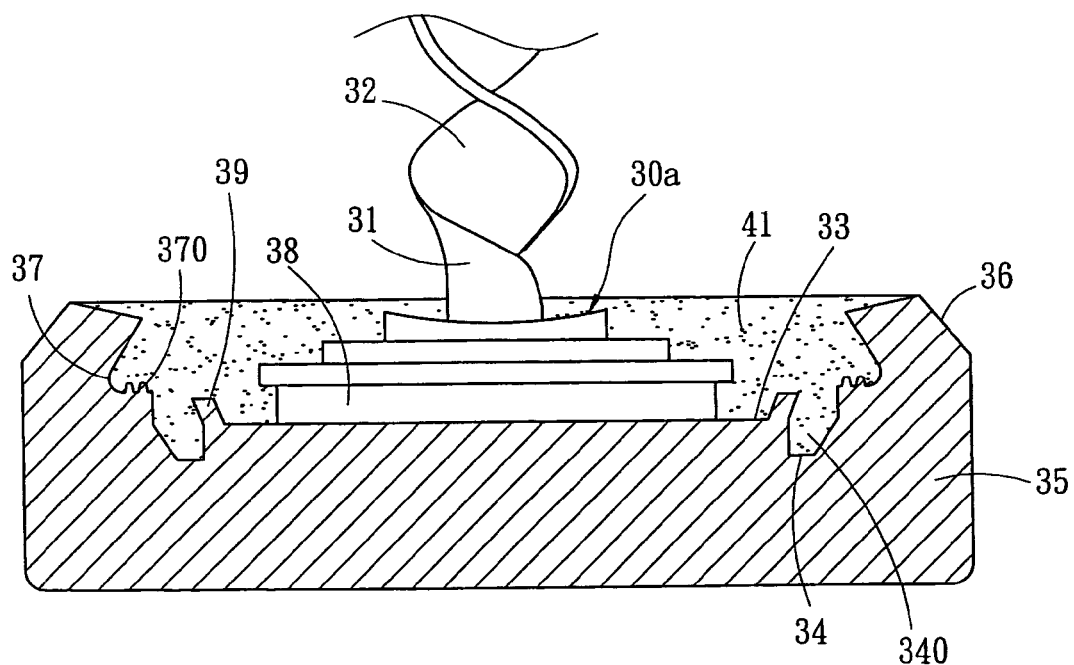
FIG. 5 is a sectional view of another embodiment of the invention.

Refer to FIG. 5 for another embodiment of the invention. Its main difference from the previous one is the base 30a. It is a multi-layer structure with a recess on the top end. The thickness of the base 30a increases. Hence the stability is enhanced and the recess can also prevent the moisture from seeping in. The bend spot 37 also has a plurality of latch rings 370 formed in flanges.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A rectification chip terminal structure for soldering a rectification chip on a terminal filled with a packaging material to form a secured mounting for the rectification chip to be inserted in a coupling bore of a circuit board, comprising:
    a base soldering on a back side of the rectification chip;
    a root extending upwards from the base;
    a buffer portion having one end connecting to the root and a helical structure to prevent bending and deformation under external forces;
    a deck located in the rectification chip terminal for soldering the rectification chip having a bulged ring extended therefrom for coupling and preventing the packaging material from breaking away from the terminal;
    a surrounding portion surrounding a distal end of the rectification chip terminal;
    a spacer zone surrounded the periphery of the deck having a space to form a stress buffer zone and prevent moisture from entering;
    a tapered section located on the top end of the surrounding portion inclining towards the center of the rectification chip terminal to facilitate insertion and installation; and
    a bend spot located between the surrounding portion and the tapered section having a plurality of latch rings for coupling and preventing moisture from seeping in.

2. The rectification chip terminal structure of claim 1, wherein the base is a flat plate.

3. The rectification chip terminal structure of claim 1, wherein the base is a multi-layer structure which has a recess on the top end.

4. The rectification chip terminal structure of claim 1, wherein the terminal has a plurality of bulged traces on the peripheral surface to facilitate coupling with the coupling bore of the circuit board.

5. The rectification chip terminal structure of claim 1, wherein the latch rings are formed in annular ditches or flanges for coupling and preventing the moisture from seeping in.

* * * * *